United States Patent [19]
Li et al.

[11] Patent Number: 5,470,936
[45] Date of Patent: Nov. 28, 1995

[54] PROCESS FOR PREPARING HIGH-ADHESION AND HIGH-SOLUBILITY POLY (AMIDE-IMIDE-ESTER)

[75] Inventors: Chien-Hui Li, Hsinchu; Han L. Chen, Nantou-Hsien; Tzong-Ming Lee, Tainan, all of Taiwan

[73] Assignee: Industrial Technology Research Institute, Hsinchu, Taiwan

[21] Appl. No.: 70,539

[22] Filed: May 28, 1993

[51] Int. Cl.$^6$ .................................. C08G 18/30
[52] U.S. Cl. ...................... 528/73; 528/80; 528/84
[58] Field of Search ........................ 528/73, 80, 84

[56] References Cited

U.S. PATENT DOCUMENTS

| | | | |
|---|---|---|---|
| 3,238,181 | 3/1966 | Anderson | 528/73 |
| 3,277,117 | 10/1966 | Van Strien et al. | 549/242 |
| 3,541,038 | 11/1970 | Nakano et al. | 524/726 |
| 3,555,113 | 1/1971 | Sattler | 528/73 |
| 3,560,446 | 2/1971 | Zecher et al. | 528/73 |
| 3,843,587 | 10/1974 | Keating et al. | 528/73 |
| 3,853,813 | 12/1974 | Edelman et al. | 528/73 |
| 3,952,084 | 4/1976 | Edelman et al. | 528/80 |
| 4,061,622 | 12/1977 | Onder | 528/84 |
| 4,251,649 | 2/1981 | Hara et al. | 528/80 |
| 4,294,952 | 10/1981 | Mukoyama et al. | 528/73 |
| 4,379,879 | 4/1983 | Okada et al. | 528/73 |
| 4,427,822 | 1/1984 | Nishizawa et al. | 528/73 |
| 4,447,589 | 5/1984 | Nishizawa et al. | 528/73 |
| 4,816,544 | 3/1989 | Komiya et al. | 528/73 |

*Primary Examiner*—James J. Seidleck
*Assistant Examiner*—Rabon Sergent
*Attorney, Agent, or Firm*—W. Wayne Liauh

[57] ABSTRACT

A high-solubility and high-adhesion poly(amide-imide-ester) resin prepared from a monomer composition comprising: (a) a diisocyanate such as diphenylmethane 4,4'diisocyanate; (b) a trimellitic anhydride; and (c) a bis-anhydride of trimellitic anhydride such as 1,2 bis(trimellitate)ethane dianhydride, dissolved in an appropriate solvent system. Each of the trimellitic anhydride and the bisanhydride of trimellitic anhydride constitutes 1 to 40%, on a molar basis, of the monomer composition and the amount of the diisocyanate is about 1.0 to 1.2 times, also on a molar basis, the sum of the trimellitic anhydride and the bis-anhydride of trimellitic anhydride. In an alternate embodiment, a fourth component (d) diacid such as isophthalic acid can be added to the monomer composition. After the polymerization reaction, the poly(amide-imide-ester) resin so produced can be diluted with a variety of organic solvents, such as xylene and dimethylacetamide, etc., and directly coated onto a copper foil to make polymer/metal laminates without going through an intermediate step involving polyamic acid.

12 Claims, 1 Drawing Sheet

PROCESS FOR PREPARING HIGH-ADHESION AND HIGH-SOLUBILITY POLY (AMIDE-IMIDE-ESTER)

FIELD OF THE INVENTION

This invention relates to a novel process for preparing poly(amide-imide-ester), which provides high-adhesion with a copper foil and high solubility in organic solvents. More particularly, this invention relates to a process for preparing copolymers that contain amide, imide and ester groups in the backbone thereof, which retain and/or enhance all the advantageous properties, such as high heat-resistance, mechanical strength and filmability, of imide-containing polymers, while providing high-adhesion with a copper foil and high solubility in organic solvents.

BACKGROUND OF THE INVENTION

Imide-containing compounds are well-known to exhibit excellent heat resistance. It is also well-known in the art that polyimides provide excellent heat-resistant characteristics. Because of their excellent mechanical strength and heat resistance, polyimides have been widely used as the base material in making soft printed circuit board (PCB), packaging material for electronic components, wire varnish, etc. One of the major problems associated with polyimides, however, is that they are insoluble in most organic solvents, thus causing a great deal of difficulty in attempting to use solution technique for the fabrication of polyimide-based products. Typically, a precursor of polyimide, which is polyamic acid, is first synthesized and used in the fabrication process in making the polyimide-based products. After fabrication, the polyamic acid is subsequently converted to polyimide via an imidization reaction.

The need to involve polyamic acid in the polyimide fabrication processes presents a number of other problems such as the problem of storage of polyamic acid and the problems related to the strong corrosiveness of the acid, both problems have caused serious environmental concerns. Furthermore, a de-watering procedure is required to convert polyamic acid to polyimide in the imidization step, thus further complicating the fabrication process and introducing a waste disposal problem.

Another problem experienced with the polyimide resins is their lack of adhesion with metals, particularly with copper foils. Adhesion is an extremely important property in the use of polymers in electrical circuit applications because it determines, to a great extent, the overall reliability of the circuit. Failure in adhesion could, for example, lead to microvoids which could trap moisture and thereby lead to corrosion failure.

U.S. Pat. No. 3,541,038 ('038 patent) discloses a polyimidamide synthesized from the polycondensation of diisocyanate and trimellitic acid monomers. In the '038 patent, polyimidamide was prepared in the presence of a suitable organic solvent such as dimethylacetamide (DMAC), dimethylformamide (DMF) and N-methyl-2-pyrrolidone (NMP). Best result was observed when NMP was used as solvent. Since NMP is a relatively expensive chemical, it is, therefore, desirable to develop a process that can make imide-containing polymer in a less expensive solvent system to thus reduce the cost of manufacturing therefor.

A number of U.S. patents also disclosed various types of polyamideimide compositions, for example: U.S. Pat. Nos. 3,716,519, 3,829,399, 4,061,623, 4,094,864, 4,332,925, 4,431,758, 4,599,383, 4,831,104, 4,927,906, 4,978,736, 4,987,197, 5,019,642, 5,028,688, 5,068,307, and 5,155,206. None of these patents, however, provides satisfactory solutions to the solubility and adhesion problems.

SUMMARY OF THE INVENTION

The primary object of this invention is to provide a polymerization process for the preparation of copolymers of amide, imide, and ester, hereinafter "poly(amide-imide-ester)", which retains and/or enhances all the advantageous properties, such as high heat-resistance, mechanical strength and filmability, of imide-containing polymers or copolymers prepared from prior art processes, while providing improved adhesion with metals, such as copper foils, and improved solubility in organic solvents, particularly in a greater variety of less expensive and more commonly used industrial solvents.

In the process disclosed in the present invention, the poly(amide-imide-ester) polymer is prepared from the following monomers:

(A) a diisocyanate such as MDI diphenylmethane 4,4'-diisocyanate (MDI) represented by the following formula:

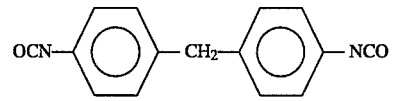

examples of other appropriate diisocyanates for practicing the present invention include: hexamethylene diisocyanate, trans-cyclohexane 1,4-diisocyanate, isophorone diisocyanate, 2,2,4- and 2,4,4-trimethylene diisocyanate, m-tetramethylxylene diisocyanate, p-tetramethylxylene diisocyanate, dicyclohexylmethane 4,4'-diisocyanate, m-phenylene diisocyanate, toluene 2,4-diisocyanate, diphenylmethane 2,4'-diisocyanate,. etc.;

(B) a trimellitic anhydride (TMA) represented by the following formula:

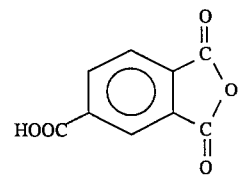

a bis-anhydride of trimellitic anhydride such as 1,2 bis(trimellitate)ethane dianhydride (TMEG) represented by the following formula:

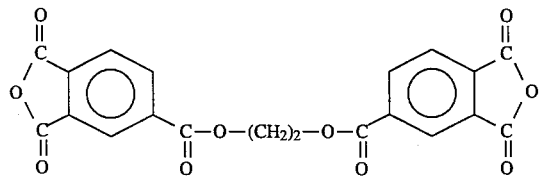

examples of other appropriate dianhydrides include: 2,2'-bis(p-trimellitoxy phenyl) propane dianhydride, p-phenylene bis(trimellitate) dianhydride, etc.

Alternately, the poly(amide-imide-ester) polymer can be prepared from the above listed monomers and a fourth monomer, which is:

(D) a diacid such as isophthalic acid (IPA) represented by the following formula:

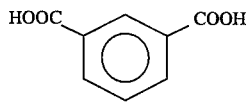

examples of other appropriate diacids include aliphatic diacids:

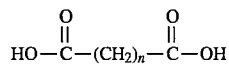

wherein n is an integer from 1 to 12.

The molar proportion of monomer C of the total moles of monomers, i.e., C/(A+B+C) or C/(A+B+C+D) should be about 1 to 40%. The molar proportion of monomer D of the total moles of monomers, i.e., D/(A+B+C+D) should also be about 1 to 40%. It is preferred that the molar ratio between monomer A and monomers (B+C) is about 1 to 1.2 in the first monomer composition (i.e., A+B+C). A similar molar ratio is also preferred between monomer A and monomers (B+C+D) in the second monomer composition (i.e., A+B+C+D).

Polymerization among monomers A, B, and C, or among A, B, C, and D, can be proceeded in appropriate solvent such as: DMAC (dimethylacetamide), DMF (dimethylformamide), and NMP (N-methyl-2-pyrrolidone), or a mixture thereof with xylene. Reaction time typically is about 2 to 5 hours. After polymerization, relatively inexpensive solvents such as xylene, DMF, Solvesso, toluene,, etc., or a mixture thereof, can be used to dilute the polymerization product. Other solvent such as phenol, cresol, cresylic acid, diols, DMSO (dimethyl sulfoxide), pyridine, diethyl carbonate, lactam, etc., can also be used, in whole or in part, as diluent for the polymerization product.

The process disclosed in the present invention can be summarized in FIG. 1.

DETAILED DESCRIPTION OF PREFERRED EMBODIMENTS

Figure 1:
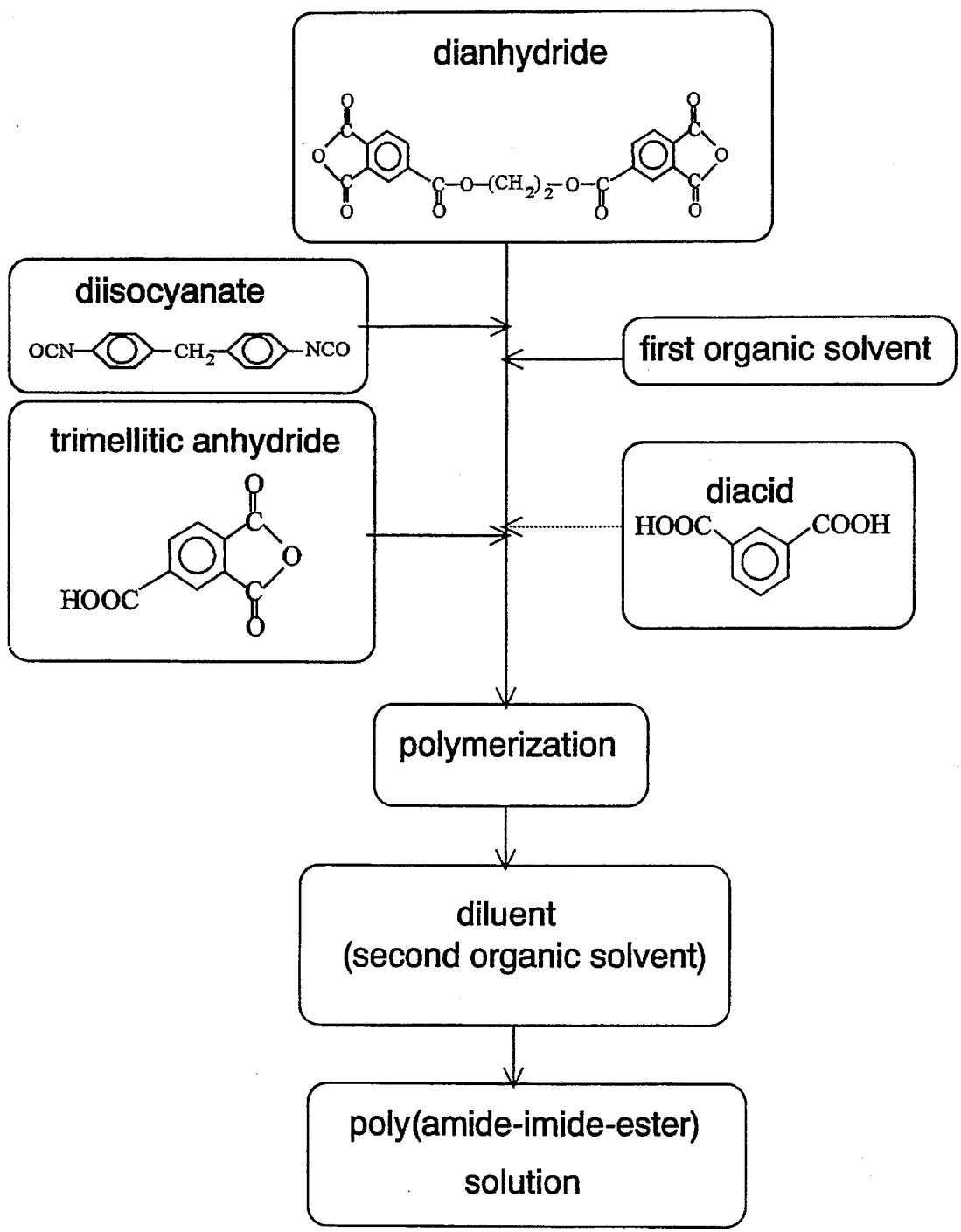
FIG. 1 is a flowchart diagram showing the steps involved in the preparation of poly(amideimide-ester) of the present invention.

Now referring to the drawing In FIG. 1, it is shown a flowchart diagram showing the steps involved in the preparation of "poly(amide-imide-ester)" of the present invention. Monomers TMA (trimellitic acid), MDI (diphenylmethane 4,4'diisocyanate) and TMEG (1,2 bis[trimellitate]ethane dianhydride), or in an alternate embodiment, with the addition of a fourth monomer IPA (isophthalic acid), were charged into a reaction vessel along with an appropriate solvent system. After the polymerization reaction, a diluent is added to the reaction mixture to prepare a poly(amide-imide-ester) solution, which can be directly used in subsequent fabrication processes without going through the polyamic acid route.

The present invention will now be described more specifically with reference to the following examples. It is to be noted that the following descriptions of examples including preferred embodiments of this invention are presented herein for purpose of illustration and description; it is not intended to be exhaustive or to limit the invention to the precise form disclosed.

EXAMPLE 1

A polymerization reaction mixture containing 362.2 g of TMA, 510 g of MDI, 41 g of TMEG, 636 g of xylene, and 300 g of DMAC was charged into a 3-L reaction vessel and was allowed to react at 80° C. for 0.5 hour, and then at 130° C. for 2 hours. Thereafter, the polymerization product was diluted with 475 g of DMF. The viscosity of the diluted polymer solution, which had a polymer content of 40%, was measured to be 3,400 cp (at 30° C.). A film coating was obtained using a rigid knife coating technique on a glass plate which was then dried in a 200° C. oven for 2 hours.

The polymer product, which contained amide, imide and ester groups in the backbone thereof, was tested to measure its mechanical properties, glass transition temperature, Tg, thermal decomposition temperature, Td, and its peel strength with a copper foil. In these tests, glass transition temperature was measured using Du Pont TMA 2940 under a nitrogen environment and at a rate of temperature increase of 20° C./min. The thermal decomposition temperature was measured using Du Pont TEA 951, also under a nitrogen environment but at a rate of temperature increase of 10° C./min. Thermal decomposition temperature was defined as the temperature at which the polymer specimen experienced a 5% weight loss. Peel strength with a copper foil was measured according to the methodology described in IPC No. 2.4.9. Mechanical properties of the polymer product, which include tensile strength and elongation (at yield), were measured according to the ASTM D638 protocol. Results of these tests are summarized in Table 1. The polyamide-imide-ester of this example showed a tensile strength of 8.9 kg/mm$^2$, and an elongation (at yield) of 11.4%. In the examples that follow, the polymer products were tested with the same procedure and the same equipment, unless otherwise noted.

EXAMPLE 2

The polymerization reaction mixture and conditions were the same as those in Example 1, except that the amounts of DMAC and xylene solvents in the reaction mixture were 325 g and 400 g, respectively, and that the reaction time at 130° C. was 3 hours. Furthermore, 250 g of NMP was added as solvent in the reaction mixture. Test results of the polyamide-imide-ester of this example are summarized in Table 1.

EXAMPLE 3

The polymerization reaction mixture and conditions were the same as those in Example 1, except that the amounts of DMAc and xylene in the reaction mixture were 525 g and 380 g, respectively, and that the reaction time at 130° C. was 4 hours. Test results of the polyamide-imide-ester of this example are summarized in Table 1.

EXAMPLE 4

The polymerization reaction mixture and conditions were the same as those in Example 1, except that the amounts of DMAc and xylene in the reaction mixture were 507 g and 430 g, respectively, and that the reaction times at 80° C. and 130° C. were 1 hour and 3 hours, respectively. Test results of the polyamide-imide-ester of this example are summarized in Table 1.

EXAMPLE 5

The polymerization reaction mixture and conditions were the same as those in Example 1, except that the amounts of DMAC and xylene in the reaction mixture were 508 g and 400 g, respectively. Test results of the polyamide-imide-ester of this example are summarized in Table 1.

Examples 1 through 5 illustrate an important advantage of the present invention in that the polymerization reaction can be conducted in a more commonly used and less expensive solvent system, due to the improved solubility of the polyamide-imide-ester of the present invention.

EXAMPLE 6

A polymerization reaction mixture containing 30.5 g of TMA, 58.1 g of MDI, 16.4 g of TMEG, and 100 ml of NMP was charged into a 500-ml reaction vessel and was allowed to react at 80° C. for 0.5 hour, and then at 150° C. for 1 hour. Thereafter, the polymerization product was added with a mixture solvent containing 50 ml xylene and 50 ml DMF, and the reaction was continued at 150° C. for two hours. The polyamide-imide-ester film from this example showed a tensile strength of 8.59 kg/mm$^2$, an elongation (at yield) of 12.2%, a glass transition temperature of 267° C., and a peel strength with copper foil of 9.0 lb/in. Test results of the polyamide-imide-ester of this example are summarized in Table 2.

EXAMPLE 7

The polymerization reaction mixture and conditions were the same as those in Example 6, except that the solvent mixture contained 50 ml xylene and 50 ml NMP. Test results of the polyamide-imide-ester of this example are summarized in Table 2.

EXAMPLE 8

The polymerization reaction mixture and conditions were the same as those in Example 6, except that the solvent mixture contained 50 ml xylene and 30 ml NMP. Test results of the polyamide-imide-ester of this example are summarized in Table 2.

EXAMPLE 9

The polymerization reaction mixture and conditions were the same as those in Example 6, except that the solvent mixture contained 40 ml xylene and 40 ml NMP. Test results of the polyamide-imide-ester of this example are summarized in Table 2.

Comparative Example 1

A polymerization reaction mixture containing 41.75 g of TMA, 58.1 g of MDI, 50 ml of NMP and 50 ml of xylene was charged into a 500-ml reaction vessel and was allowed to react at 80° C. for 0.5 hour, and then at 150° C. After one hour at 150° C. precipitation was observed. The occurrence of precipitation indicates the poor solubility of polyamide-imide. On comparison, the polyamide-imide-esters of previous examples indicate excellent solubility, thus allowing the polymerization reaction to be conducted in a less expensive solvent system which is an important object of the present invention.

EXAMPLE 10

A polymerization reaction mixture containing 19 g of TMA, 55 g of MDI, 41 g of TMEG, and 200 ml of NMP was charged into a 500-ml reaction vessel and was allowed to react at 80° C. for 0.5 hour, and this example showed a tensile strength of 8.7 kg/mm$^2$, an elongation (at yield) of 10.3%, and a peel strength with copper foil of 10 lb/in. Test results of the polyamide-imide-ester of this example are summarized in Table 3.

EXAMPLE 11

The polymerization reaction conditions were the same as those in Example 10, but the reaction mixture contained 39.4 g of TMA, 52 g of MDI, 10.25 g of TMEG, and 235 ml of NMP. Test results of the polyamide-imide-ester of this example are summarized in Table 3.

EXAMPLE 12

A polymerization reaction mixture containing 53.8 g of IPA, 15.25 g of TMA, 130 g of MDI, 32.82 g of TMEG, and 500 ml of NMP was charged into a 1-L reaction vessel and was allowed to react at 80° C. for 0.5 hour, and then at 120° C. for 2.5 hours. The polyamide-imide-ester film prepared from this example showed a tensile strength of 9.29 kg/mm$^2$, an elongation (at yield) of 12%, a glass transition temperature of 265° C., a thermal decomposition temperature of 454° C., and a peel strength with copper foil of 11.4 lb/in.

Comparative Example 2

A polymerization reaction mixture containing 192.1 g of TMA, 250.3 g of MDI, and 1,000 ml of NMP was allowed to react at 80° C. for 0.5 hour, and then at 150° C. for 3 hours. The polyamide-imide film from this example showed a tensile strength of 10 kg/mm$^2$, an elongation (at yield) of 15%, a thermal decomposition temperature of 460° C., and a peel strength with copper foil of 8.8 lb/in.

Comparing Example 12 and Comparative Example 2, it is clear that the polyamide-imide-esters of the present invention exhibit superior peel strength over the prior art polyamideimide. This is another important object of the present invention.

Comparative Example 3

A commercial polyamide-imide with a tradename "Isomid" manufactured by Schenectady Chemicals, Inc was tested which showed a tensile strength of 7.74 kg/mm$^2$, an elongation (at yield) of 6.5%, and a thermal decomposition temperature of 427° C. Comparing Example 12 and Comparative Example 3, it is evident that the polyamide-imide-ester of the present invention has superior heat resistance relative to prior art polyamide-imide.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

TABLE I

| Example No. | First Solvent System | | | Reaction Time (hr) | | Second Solvent | Tensile Stress | Elonga- | Viscosity |
|---|---|---|---|---|---|---|---|---|---|
| | NMP (g) | xylene (g) | DMAC (g) | @80° C. | @130° C. | DMF | (kg/mm$^3$) | tion (%) | (cp) |
| 1 | — | 636 | 300 | 0.5 | 2 | 475 | 8.9 | 11.4 | 3,400 |
| 2 | 250 | 400 | 325 | 0.5 | 3 | 475 | — | — | 2,680 |
| 3 | — | 380 | 525 | 0.5 | 4 | 475 | 9.1 | 8.9 | 5,000 |
| 4 | — | 430 | 507 | 1.0 | 3 | 475 | 9.6 | 12.6 | 5,750 |
| 5 | — | 400 | 508 | 0.5 | 2 | 475 | 10.7 | 14.3 | 6,800 |

TABLE 2

| Example No. | NMP (ml) | xylene (ml) | Tentile Strength (kg/mm$^2$) | Elongation (%) | Tg (°C.) | Peel Strength (lb/in) |
|---|---|---|---|---|---|---|
| 6 | 100 | — | 8.59 | 12.2 | 267 | 9.0 |
| 7 | 50 | 50 | 8.96 | 13.9 | 264 | |
| 8 | 30 | 50 | 9.46 | 12.3 | 264 | |
| 9 | 40 | 40 | 7.64 | 12.0 | 260 | |

TABLE 3

| Example No. | TMEG (g) | TMA (g) | MDI (g) | NMP (ml) | Tensile Strength (kg/mm$^2$) | Elongation (%) | Peel Strength (lb/in) |
|---|---|---|---|---|---|---|---|
| 10 | 41 | 19 | 55 | 200 | 8.7 | 10.5 | 10 |
| 11 | 10.25 | 39.4 | 52 | 235 | 8.5 | 12.2 | |

What is claimed is:

1. A poly(amide-imide-ester) resin prepared from a monomer composition dissolved in an organic solvent, said monomer composition comprising:
   (a) a diisocyanate;
   (b) a trimellitic anhydride; and
   (c) a bis-anhydride of trimellitic anhydride; wherein each of said trimellitic anhydride and said bis-anhydride of trimellitic anhydride constituting 1 to 40%, on a molar basis, of said monomer composition, and the amount of said diisocyanate equaling about 1.0 to 1.2 times, also on a molar basis, the sum of said trimellitic anhydride and said bis-anhydride of trimellitic anhydride, wherein said poly(amide-imide-ester) is soluble in dimethylacetamide (DMAC), dimethylformamide (DMF), or N-methyl-2-pyrrolidone (NMP).

2. The poly(amide-imide-ester) resin of claim 1 wherein said monomer composition further comprises about 1 to 40 mol % of a diacid, and said diisocyanate equaling about 1.0 to 1.2 times, on a molar basis, the sum of said trimellitic anhydride, said bis-anhydride of trimellitic anhydride, and said diacid.

3. The poly(amide-imide-ester) resin of claim 2 wherein said diacid is isophthalic acid represented by the following formula:

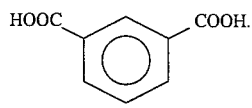

4. The poly(amide-imide-ester) resin of claim 2 wherein said diacid is an aliphatic diacid represented by the following formula:

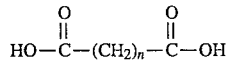

wherein n is an integer from 1 to 12.

5. The poly(amide-imide-ester) resin of claim 1 wherein said diisocyanate is diphenylmethane 4,4'-diisocyanate represented by the following formula

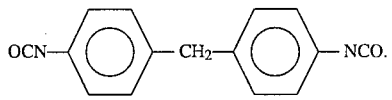

6. The poly(amide-imide-ester) resin of claim 1 wherein said bis-anhydride of trimellitic anhydride is 1,2 bis(trimellitate)ethane dianhydride represented by the following formula:

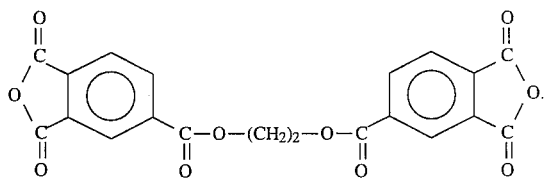

7. The poly(amide-imide-ester) resin of claim 1 wherein said diisocyanate is selected from the group consisting of diphenylmethane 4,4'-diisocyanate, hexamethylene diisocyanate, trans-cyclohexane 1,4-diisocyanate, isophorone diisocyanate, 2,2,4- and 2,4,4-trimethylene diisocyanate, m-tetramethylxylene diisocyanate, p-tetramethylxylene diisocyanate, dicyclohexylmethane 4,4'-diisocyanate, m-phenylene diisocyanate, toluene 2,4-diisocyanate, and diphenylmethane 2,4'-diisocyanate.

8. The poly(amide-imide-ester) resin of claim 1 wherein said bis-anhydride of trimellitic anhydride is selected from the group consisting of 2,2'-bis(p-trimellitoxy phenyl) propane dianhydride and p-phenylene bis(trimellitate) dianhydride.

9. A process for making poly(amide-imide-ester) resin comprising the steps of:

(a) preparing a monomer composition containing at least a diisocyanate, a trimellitic anhydride and a bis-anhydride of trimellitic anhydride dissolved in a solvent system, wherein the molar proportions of said trimellitic anhydride and said bis-anhydride of trimellitic anhydride relative to the total moles of the monomers are from 1 to 40%, the moles of said diisocyanate equaling about 1.0 to 1.2 times the sum of said trimellitic anhydride and said bis-anhydride of trimellitic anhydride; and (b) heating said monomer composition to effectuate a polymerization reaction; wherein said poly(amide-imide-ester) is soluble in dimethylacetamide (DMAC), dimethylformamide (DMF), or N-methyl-2-pyrrolidone (NMP).

10. The poly(amide-imide-ester) resin of claim 9 wherein said monomer composition further comprises about 1 to 40 mol % of a diacid, and said diisocyanate equaling about 1.0 to 1.2 times, on a molar basis, the sum of said trimellitic anhydride, said bis-anhydride of trimellitic anhydride, and said diacid.

11. The process of making the poly(amide-imide-ester) resin of claim 10 wherein said diacid is isophthalic acid or an aliphatic diacid represented by the following formula:

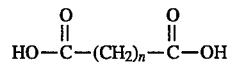

wherein n is an integer from 1 to 12.

12. The process of making the poly(amide-imide-ester) resin of claim 9 wherein:

(a) said diisocyanate is selected from the group consisting of diphenylmethane 4,4'diisocyanate, hexamethylene diisocyanate, trans-cyclohexane 1,4-diisocyanate, isophorone diisocyanate, 2,2,4- and 2,4,4-trimethylene diisocyanate, m-tetramethylxylene diisocyanate, p-tetramethylxylene diisocyanate, dicyclohexylmethane 4,4'-diisocyanate, m-phenylene diisocyanate, toluene 2,4-diisocyanate, and diphenylmethane 2,4'-diisocyanate; and (b) said bis-anhydride of trimellitic anhydride is selected from the group consisting of 1,2 bis(trimellitate)ethane dianhydride, 2,2'-bis(p-trimellitoxy phenyl) propane dianhydride and p-phenylene bis(trimellitate) dianhydride.

* * * * *